United States Patent
Kim et al.

(10) Patent No.: US 11,157,201 B2
(45) Date of Patent: Oct. 26, 2021

(54) MEMORY SYSTEM AND OPERATING METHOD THEREOF

(71) Applicant: SK hynix Inc., Gyeonggi-do (KR)

(72) Inventors: Jung Ae Kim, Gyeonggi-do (KR); Yeong Dong Gim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 189 days.

(21) Appl. No.: 16/059,242

(22) Filed: Aug. 9, 2018

(65) Prior Publication Data

US 2019/0220228 A1 Jul. 18, 2019

(30) Foreign Application Priority Data

Jan. 15, 2018 (KR) .................. 10-2018-0005062

(51) Int. Cl.
*G06F 3/06* (2006.01)
*G06F 9/4401* (2018.01)
*G11C 16/20* (2006.01)

(52) U.S. Cl.
CPC .......... *G06F 3/0659* (2013.01); *G06F 3/0604* (2013.01); *G06F 3/0605* (2013.01); *G06F 3/0632* (2013.01); *G06F 3/0658* (2013.01); *G06F 3/0679* (2013.01); *G06F 9/4401* (2013.01); *G11C 16/20* (2013.01)

(58) Field of Classification Search
CPC .... G06F 3/0659; G06F 3/0605; G06F 3/0632; G06F 3/0658; G06F 9/4401; G06F 3/0604; G06F 3/0679; G11C 16/20; G11C 7/20; G11C 15/04
See application file for complete search history.

(56) References Cited

U.S. PATENT DOCUMENTS

| | | | | |
|---|---|---|---|---|
| 7,219,187 B1* | 5/2007 | Khanna | ........... | H04L 45/00 365/49.17 |
| 7,260,673 B1* | 8/2007 | Ross | ........... | G11C 15/00 365/49.15 |
| 9,099,193 B2* | 8/2015 | Kim | ........... | G11C 11/5628 |
| 10,191,666 B1* | 1/2019 | Lewis | ........... | G06F 3/0613 |
| 10,916,277 B2* | 2/2021 | Lim | ........... | G11C 7/222 |
| 2004/0255205 A1* | 12/2004 | Oodate | ........... | G11C 16/20 714/54 |
| 2007/0033333 A1* | 2/2007 | Kato | ........... | G11C 16/0416 711/103 |
| 2008/0209150 A1* | 8/2008 | Byeon | ........... | G11C 16/20 711/166 |

(Continued)

FOREIGN PATENT DOCUMENTS

KR   1020170078407   7/2017

*Primary Examiner* — Francisco A Grullon
(74) *Attorney, Agent, or Firm* — IP & T Group LLP

(57) ABSTRACT

A memory system includes a nonvolatile memory device including a CAM (content addressable memory) region; and a controller including a random access memory which stores an initial setting parameter of the nonvolatile memory device and a control unit which controls an initializing operation for a setting parameter of the nonvolatile memory device stored in the CAM region, wherein the control unit includes a parameter determination circuit which determines whether the initializing operation has succeeded or not, by comparing a verify parameter received from the nonvolatile memory device and the initial setting parameter.

19 Claims, 11 Drawing Sheets

(56) References Cited

U.S. PATENT DOCUMENTS

| | | | | |
|---|---|---|---|---|
| 2009/0187703 A1* | 7/2009 | Oodate | ............... | G11C 16/20 |
| | | | | 711/103 |
| 2010/0302826 A1* | 12/2010 | Kim | ............... | G11C 15/00 |
| | | | | 365/49.1 |
| 2010/0302860 A1* | 12/2010 | Oh | ............... | G11C 11/5628 |
| | | | | 365/185.19 |
| 2012/0191964 A1* | 7/2012 | Lee | ............... | G06F 11/2289 |
| | | | | 713/2 |
| 2013/0024677 A1* | 1/2013 | Smith | ............... | G06F 21/57 |
| | | | | 713/1 |
| 2015/0127930 A1* | 5/2015 | Offenberg | ............... | G06F 21/572 |
| | | | | 713/2 |
| 2016/0246672 A1* | 8/2016 | Yang | ............... | G06F 3/0679 |
| 2017/0185781 A1* | 6/2017 | Kim | ............... | G06F 21/575 |

\* cited by examiner

MEMORY SYSTEM AND OPERATING METHOD THEREOF

CROSS-REFERENCE TO RELATED APPLICATION

The present application claims priority under 35 U.S.C. § 119(a) to Korean application number 10-2018-0005062, filed on Jan. 15, 2018, in the Korean Intellectual Property Office, which is incorporated herein by reference in its entirety.

BACKGROUND

1. Technical Field

Various exemplary embodiments of the present disclosure generally relate to a memory system. Particularly, the embodiments relate to a memory system including a nonvolatile memory device.

2. Related Art

A memory system may store data provided by an external device in response to a write request from the external device. Also, the memory system may provide the stored data to the external device in response to a read request from the external device. The external device may be an electronic device capable of processing data, such as a computer, a digital camera, or a mobile phone. The memory system may be built and operate in the external device, or may be manufactured as a separate component that operates coupled to the external device.

Since there is no mechanical driving part, a memory system using a memory device has various advantages such as excellent stability and durability, high information access speed, and low power consumption. Memory systems having such advantages include a universal serial bus (USB) memory device, memory cards having various interfaces, a universal flash storage (UFS) device, and a solid state drive (SSD).

SUMMARY

Various embodiments are directed to a memory system capable of obtaining an accurate result of an initialization operation for the parameters stored in a content addressable memory (CAM) region of a nonvolatile memory device.

In an embodiment, a memory system may including content addressable memory (CAM) region; and a controller including a random access memory which stores an initial setting parameter of the nonvolatile memory device and a control unit which controls an initialization operation for a setting parameter of the nonvolatile memory device stored in the CAM region, wherein the control unit includes a parameter determination circuit which determines whether the initialization operation has succeeded by comparing a verification parameter received from the nonvolatile memory device to the initial setting parameter.

In an embodiment, a method for operating a memory system, comprising: transmitting, by a controller, a verification parameter read command to a nonvolatile memory device; performing, by the nonvolatile memory device, a read operation for a verification parameter; transmitting, by the nonvolatile memory device, the verification parameter to the controller; comparing, by the controller, the verification parameter and an initial setting parameter; and determining, by the controller, whether an initialization operation for a setting parameter stored in a content addressable memory (CAM) region of the nonvolatile memory device has succeeded based on a result of the comparing of the verification parameter to the initial setting parameter.

In an embodiment, a memory system comprising a memory device suitable for storing a setting parameter thereof and a verification parameter corresponding to the setting parameter; and a controller suitable for: controlling the memory device to initialize the setting parameter, and determining success of the initialization by comparing the initialized setting parameter and the verification parameter.

In the memory system according to an embodiment, when performing an initializing operation for the parameters stored in a CAM region, an accurate result of the initializing operation may be obtained through comparison of verify parameters and initial setting parameters.

Also, by accurately determining a cause for an error occurred in the nonvolatile memory device after the initializing operation, the reliability of the memory system may be improved.

DETAILED DESCRIPTION

Figure 1:
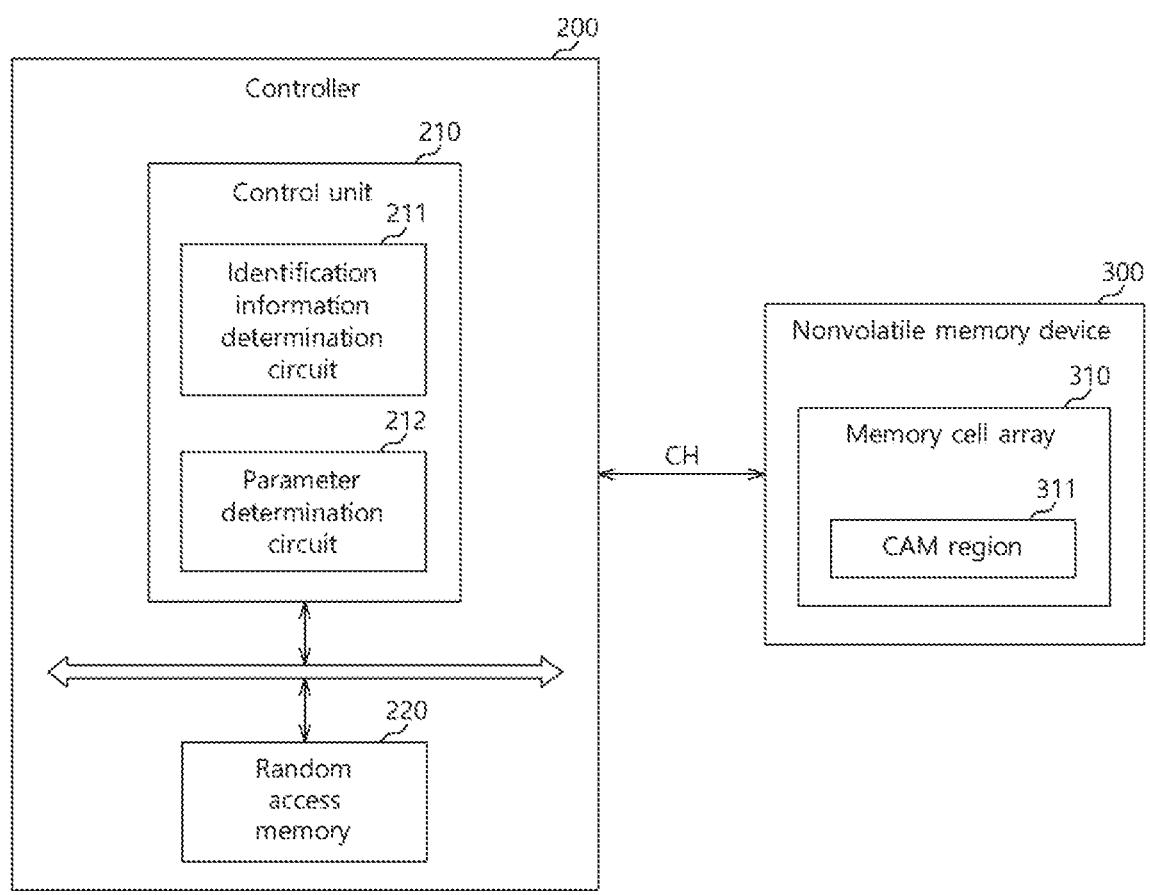
FIG. 1 is a block diagram illustrating a memory system in accordance with an embodiment.

Advantages and features of the present invention, and methods for achieving them will become more apparent after reading the following description of various embodiments taken in conjunction with the drawings. Various aspects and features of the present invention may, however, be configured or arranged differently than in the disclosed embodiments. Thus, the present invention is not to be construed as being limited to the embodiments set forth herein. Rather, these embodiments are provided to describe the present invention in detail to the extent that a person skilled in the art to which the invention pertains can easily practice the features of the present invention. Moreover, reference to "an embodiment" does not necessarily mean only one embodiment, and different references to "an embodiment" are not necessarily to the same embodiment(s).

It is to be understood that embodiments of the present invention are not limited to the particulars shown in the drawings and that the drawings are not necessarily to scale. In some instances, proportions may be exaggerated in order to more clearly depict certain features of the invention.

While particular terminology is used herein, it is to be appreciated that such terminology is for the purpose of describing particular embodiment(s) only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element, or intervening elements may be present. As used herein, a singular form is intended to include plural forms and vice versa, unless the context clearly indicates otherwise. It will be further understood that the terms "includes " and/or "including," when used in this specification, specify the presence of at least one stated feature, step, operation, and/or element, but do not preclude the presence or addition of one or more other features, steps, operations, and/or elements.

A memory system and an operating method thereof will be described below with reference to the accompanying drawings through various embodiments.

FIG. 1 is a block diagram illustrating a memory system 100 in accordance with an embodiment.

Referring to FIG. 1, the memory system 100 may store data to be accessed by a host device such as a mobile phone, an MP3 player, a laptop computer, a desktop computer, a game player, a TV, an in-vehicle infotainment system, and so forth.

The memory system 100 may be manufactured as any one of various kinds of storage devices according to a host interface, such as a transmission protocol with respect to the host device. For example, the memory system 100 may be configured as any one of various kinds of storage devices such as a solid state drive (SSD), a is multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 100 may be manufactured as any one among various package types. For example, the memory system 100 may be manufactured as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 100 may include a controller 200. The controller 200 may include a control unit 210 and a random access memory 220.

The control unit 210 may be configured by a processor, a micro control unit (MCU), a central processing unit (CPU), or integrated circuit(s). The control unit 210 may process a request which is transmitted from the host system 400. In order to process the request, the control unit 210 may drive an instruction or algorithm embodied in code or firmware (FW) loaded in the random access memory 220, and may control internal function blocks and a nonvolatile memory device 300.

According to an embodiment, the control unit 210 may include an identification information determination circuit 211 and a parameter determination circuit 212.

The identification information determination circuit 211 may determine whether the identification information of the nonvolatile memory device 300 received from such device is valid, and the controller 200 may determine whether a setting parameter initialization operation has succeeded, based on whether the identification information is valid.

The parameter determination circuit 212 may determine whether the setting parameter initialization operation has succeeded, by comparing verification parameters received from the nonvolatile memory device 300 to initial setting parameters. Detailed description for these operations is provided below.

The random access memory 220 may be configured as a dynamic random access memory (DRAM) or a static random access memory (SRAM). The random access memory 220 may store firmware (FW) which is to be driven by the control unit 210. Also, the random access memory 220 may store data necessary for driving the firmware (FW), for example, metadata. That is, the random access memory 220 may operate as the working memory of the control unit 210.

According to an embodiment, the random access memory 220 may store the initial setting parameters of the nonvolatile memory device 300. The initial setting parameters may include one is or more among a read voltage, a program voltage, an initial voltage of incremental step pulse programming (ISPP) voltages and an increment of the ISPP voltages. The control unit 210 may determine whether the setting parameter initialization operation has failed, by comparing the initial setting parameters stored in the random access memory 220 to the verification parameters received from the nonvolatile memory device 300. Detailed description for these operations is provided below.

While not shown in FIG. 1, the controller 200 may further include a host interface unit and a memory control unit.

The host interface unit may interface the host device and the memory system 100. For instance, the host interface unit may communicate with the host device through any one of standard transmission protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS), that is, by using a host interface.

The memory control unit may control the nonvolatile memory device 300 according to the control of the control unit 210. The memory control unit may also be referred to as a memory interface unit. The memory control unit may provide control signals to the nonvolatile memory device 300. The control signals may include a command, an address, a control signal, and the like for controlling the nonvolatile memory device 300. The memory control unit may provide data to the nonvolatile memory device 300 or may be provided with data from the nonvolatile memory device 300.

The memory system 100 in accordance with an embodiment may include at least one nonvolatile memory device 300.

The nonvolatile memory device 300 may be configured as any of a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide.

The nonvolatile memory device 300 may include a memory cell array 310. From an operational viewpoint or a physical (or structural) viewpoint, the memory cells included in the memory cell array 310 may be configured as a hierarchical memory cell set or memory cell unit. For example, memory cells which are coupled to the same word line and are to be read and written (or programmed) simultaneously may be configured as a page. In the following description, for the sake of convenience, memory cells configured as a page will be referred to as a "page." Also, memory cells to be erased simultaneously may be configured as a memory block. The memory cell array 310 may include a plurality of memory blocks, and each of the memory blocks may include a plurality of pages.

Figure 2:
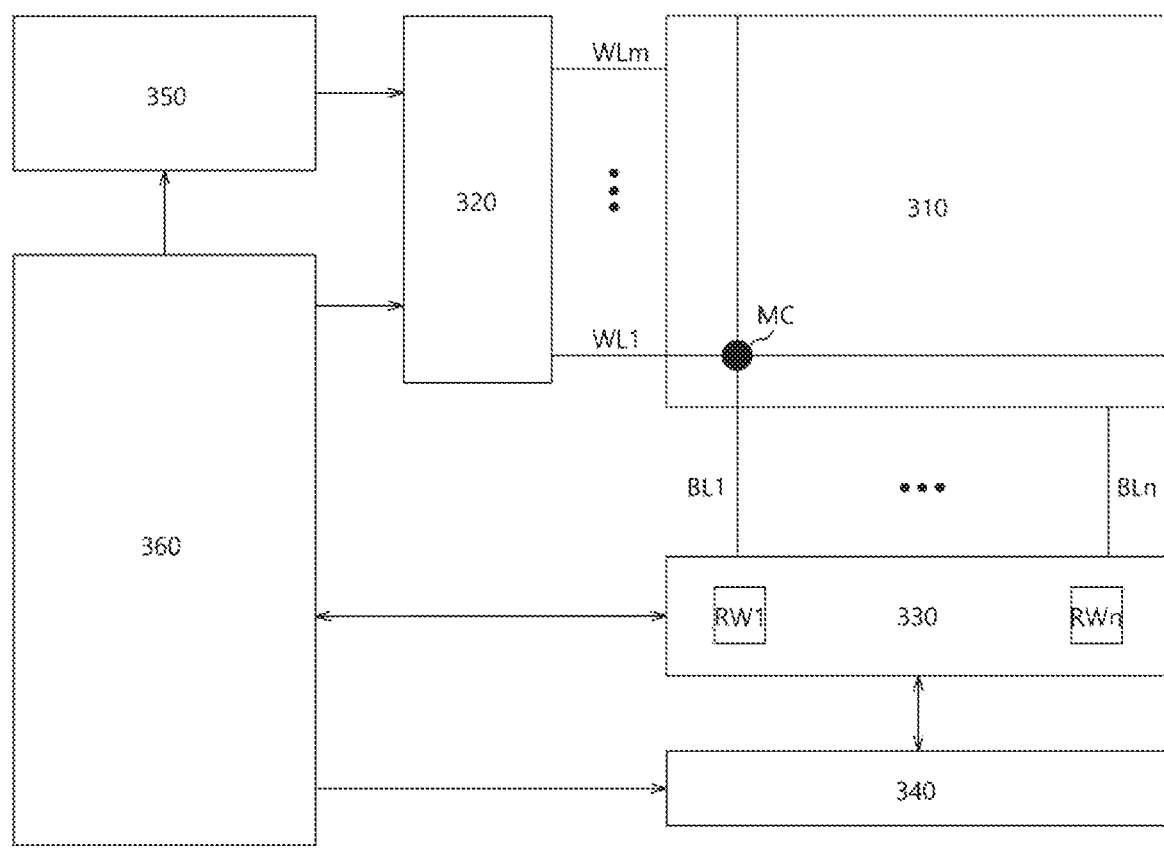
FIG. 2 is a block diagram illustrating the nonvolatile memory device included in the memory system of FIG. 1 in accordance with an embodiment.

FIG. 2 is a block diagram illustrating the at least one nonvolatile memory device 300 included in the memory system 100 of FIG. 1 in accordance with an embodiment. Referring to FIGS. 1 and 2, the nonvolatile memory device 300 may include the memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

According to an embodiment, the memory cell array 310 may include a content addressable memory (CAM) region not shown in FIG. 2. The CAM region 311 may include a plurality of memory cells which are included in at least one memory block. A memory block corresponding to the CAM region 311 may be a CAM block. The CAM block and a memory block may have the same structure. One or more setting parameters of the nonvolatile memory device 300 may be stored in the CAM region 311. In detail, conditions set in relation with data input/output operations or other information may be stored in the CAM region 311. According to an embodiment, information on a read/write count or a P/E cycle count, a failed column address and a failed block address may be stored in the CAM region 311. According to an embodiment, option information for operation of the nonvolatile memory device 300, for example, information on a read voltage, a program voltage, an initial voltage of ISPP voltages, an increment of the ISPP voltages, an erase voltage, the thickness of the gate oxide layer of each cell and various offsets, may be stored in the CAM region 311. In an embodiment, repair information may be stored in the CAM region 311. If power is supplied to the nonvolatile memory device 300, the information stored in the CAM region 311 may be read out by the control logic 360, and the control logic 360 may control the memory cell array 310 to perform data input/output operations for memory cells with conditions set according to the read-out information.

If power is supplied to the memory system 100, the memory system 100 performs a CAM reset operation for initialization. According to an embodiment, in the case where the CAM reset operation is performed, an auto CAM read operation may be performed. In this case, the setting information stored in the CAM region 311 may be loaded in the random access memory 220 included in the controller 200, and may be used for the operation of the nonvolatile memory device 300.

Referring back to FIG. 2, the row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 330 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control the general operations of the nonvolatile memory device 300, based on control signals provided from the external device. For example, the control logic 360 may control the read, write, and erase operations of the nonvolatile memory device 300.

In the present specification, 'setting parameters' may mean parameters stored in the CAM region 311 representing conditions or other information related to data input/output operations, option information for operation of the nonvolatile memory device 300, repair information, and the like, 'Initial setting parameters' may mean the setting parameters read out in the initial operation of the nonvolatile memory device 300.

According to an embodiment, the initial setting parameters may be stored in the random access memory 220 of the controller 200 by an auto CAM read operation upon booting of the memory system 100. According to another embodiment, the initial setting parameters may be read out from the nonvolatile memory device 300 in response to an initial setting parameter read command of the is controller 200, and the read-out initial setting parameters may be stored in the random access memory 220 of the controller 200. 'Verification parameters' may be the setting parameters read from the nonvolatile memory device 300 in a verify operation of the memory system 100. The controller 200 may perform a verify operation for setting parameters, by comparing the verification parameters and the initial setting parameters.

According to an embodiment, the control unit 210 may control a standby mode and a normal mode of the nonvolatile memory device 300.

The standby mode may mean a low power mode or a power save mode. The controller 200 may control entry of the nonvolatile memory device 300 to the standby mode, and may generate a plurality of control signals. In the standby mode, at least one of an operation of controlling at least one of a clock signal and an operating voltage to be applied to at least one among the components 310, 320, 330, 340, 350, and 360 included in the nonvolatile memory device 300, an operation of controlling the operation of the nonvolatile memory device 300, and an operation of controlling the data read/write block 330 may be performed to reduce the power consumption of the nonvolatile memory device 300.

In the standby mode, the control unit 210 may use a dynamic frequency scaling (DFS) algorithm, a dynamic voltage and frequency scaling (DVFS) algorithm, a dynamic power management (DPM) policy, or a combination thereof. According to the DPM policy, idle or underused system components may be selectively shut down so as to reduce power dissipation in the memory system 100.

According to an embodiment, the standby mode may be set in response to a request of the host device. For example, the standby mode may be set in the case where a request is not received from the host device in a predetermined time, and change from the standby mode to the normal mode may be made in the case where a request is received from the host device.

As described above, the controller 200 receives the initial setting parameters from the nonvolatile memory device 300 and stores the initial setting parameters in the random access memory 220 through the auto CAM read operation or in response to the initial setting parameter read command upon booting of the memory system 100.

When the memory system 100 is changed from the standby mode to the normal mode, the controller 200 performs a CAM reset operation for the setting parameters stored in the CAM region 311. The controller 200 determines whether an initialization operation, that is, the CAM reset operation for the setting parameters stored in the CAM region 311 has succeeded. In the case where it is determined that the initialization operation has succeeded, the controller 200 performs another operation (for example, a foreground operation such as a program operation and a read operation for data based on a request of the host device and a background operation such as a garbage collection operation) in the corresponding nonvolatile memory device 300. Conversely, in the case where it is determined that the initialization operation has failed, an additional verify operation for analyzing the nonvolatile memory device 300 is performed to correct an error.

The initialization operation for the setting parameters is performed in the nonvolatile memory device 300 by the control of the controller 200, and state information as a result of the initialization operation is received by the controller 200. The state information may include success information or failure information.

In the case where the state information includes the success information, the ID value (hereinafter referred to as "identification information") of the corresponding nonvolatile memory device 300 is received by the controller 200. By comparing the received identification information and the identification information stored in the controller 200, determination is made for whether the received identification information is valid identification information. In the case where it is determined that the received identification information is valid identification information, it is determined that the initialization operation for the setting parameters has succeeded.

Conversely, in the case where the state information received from the nonvolatile memory device 300 includes the failure information or it is determined that the identification information received from the nonvolatile memory device 300 is invalid identification information, it is determined that the initialization operation for the setting parameters has failed.

However, a case may occur in which it is erroneously determined that the initialization operation has succeeded, as it is erroneously determined that the state information includes the success information and the identification information is valid, even though the initialization operation has not succeeded. In this case, the possibility of an error occurring while another operation of the nonvolatile memory device 300 is performed increases. In the case where such an error occurs, a problem arises in that it takes a lot of time to find out that a fundamental cause is that the setting parameter initialization operation failed.

FIGS. 3 to 8 are flow charts explaining methods for operating a memory system in accordance with embodiments. Specifically, FIG. 3 will be described with reference to FIG. 1, and FIGS. 4 to 8 will be described with reference to FIGS. 1 and 3.

Figure 3:
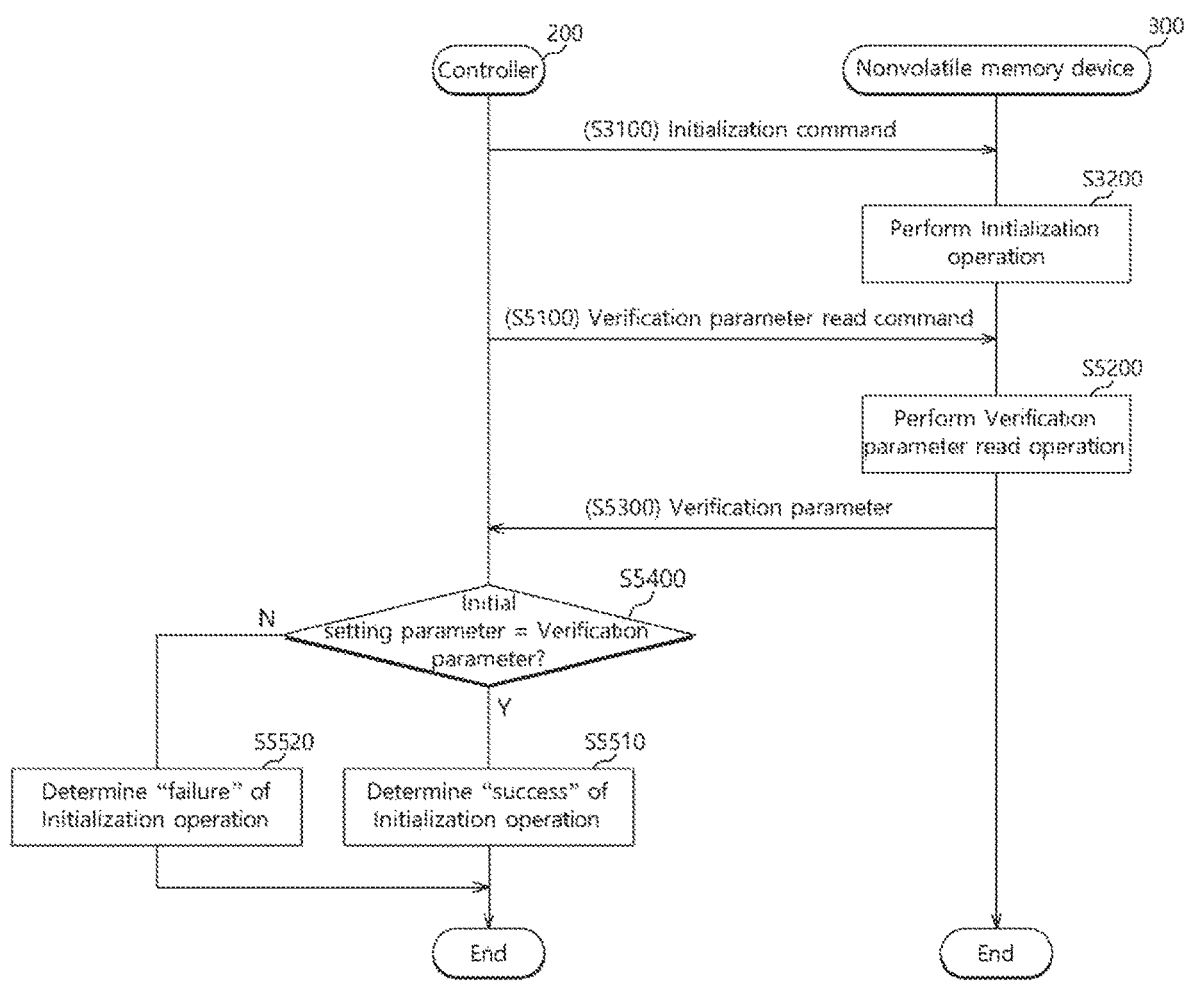
FIGS. 3 to 8 are flow charts explaining methods for operating a memory system in accordance with embodiments.

Referring to FIG. 3, the memory system 100 in accordance with an embodiment may include the nonvolatile memory device 300 including the CAM region 311 and the controller 200 including the random access memory 220 which stores the initial setting parameter of the nonvolatile memory device 300 and the control unit 210 which controls an initialization operation, that is, the CAM reset operation for the setting parameter of the nonvolatile memory device 300 stored in the CAM region 311.

According to an embodiment, the control unit 210 may include the parameter determination circuit 212 which determines whether the initialization operation has succeeded, by comparing the verification parameter received from the nonvolatile memory device 300 and the initial setting parameter. According to this embodiment, the parameter determination circuit 212 may determine that the initialization operation has succeeded in the case where the verification parameter and the initial setting parameter are the same as each other, and may determine that the initialization operation has failed in the case where the verification parameter and the initial setting parameter are not the same as each other.

In a method for operating the memory system 100 in accordance with an embodiment, a setting parameter initialization command may be transmitted to the nonvolatile memory device 300 from the controller 200 at step S3100, and a setting parameter initialization operation, that is, the CAM reset operation may be performed in the nonvolatile memory device 300 in response to the setting parameter initialization command at step S3200.

As described above, when power is supplied to the memory system 100, the memory system 100 performs the CAM reset operation for initialization. According to an embodiment, in the case where the CAM reset operation is performed, the auto CAM read operation may be performed. In this case, the setting information stored in the CAM region 311 may be loaded in the random access memory 220.

For instance, a setting parameter may include at least one among a read voltage, a program voltage, an initial voltage of ISPP voltages, and an increment of the ISPP voltages.

After the setting parameter initialization operation is performed, the controller 200 may transmit a verification parameter read command to the nonvolatile memory device 300 at step S5100, and a verification parameter read operation may be performed in the nonvolatile memory device 300 at step S5200. The verification parameters may be the setting parameters stored in the nonvolatile memory device 300.

After the verification parameter read operation is performed, the controller 200 may receive the verification parameter read from the nonvolatile memory device 300 at step S5300, and may compare the initial setting parameter stored in the random access memory 220 and the verification parameter received from the nonvolatile memory device 300 at step S5400.

In detail, it may be determined that the setting parameter initialization operation has succeeded in the case where the initial setting parameter and the verification parameter are the same as each other at step S5510, and it may be determined that the setting parameter initialization operation has failed in the case where the initial setting parameter and the verification parameter are not the same as each other at step S5520.

Figure 4:
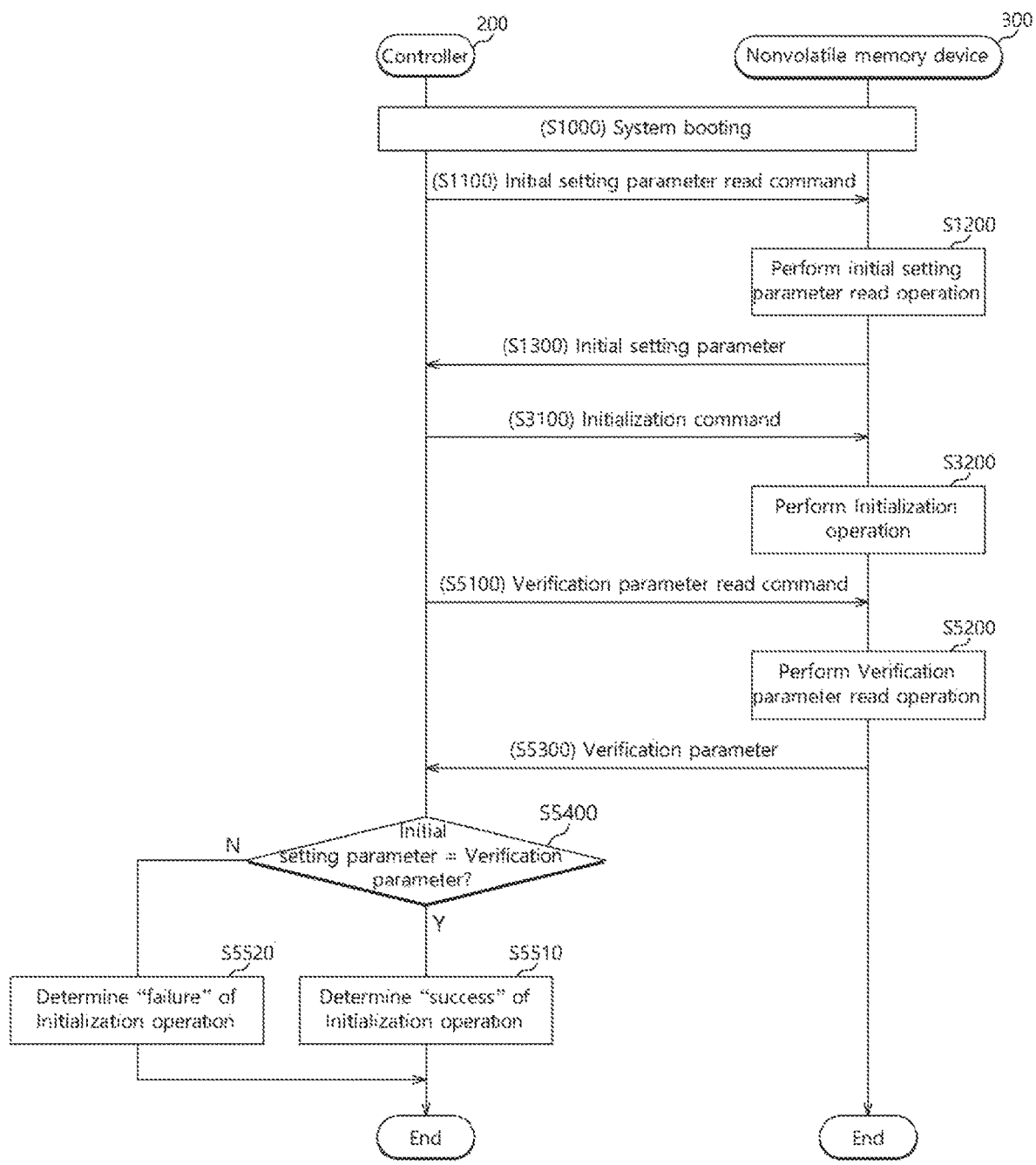

Referring to FIG. 4, after the memory system 100 is booted at step S1000, the controller 200 may transmit an initial setting parameter read command to the nonvolatile memory device 300 at step S1100. An initial setting parameter may mean the setting parameter read in the initial operation of the nonvolatile memory device 300. According to another embodiment, an initial setting parameter may be stored in the random access memory 220 of the controller 200 by an auto CAM read operation upon booting (not shown).

The nonvolatile memory device 300 may perform an initial setting parameter read operation in response to the initial setting parameter read command at step S1200, and may transmit a read initial setting parameter to the controller 200 at step S1300.

The controller 200 may store, in the random access memory 220, the initial setting parameter received from the nonvolatile memory device 300.

After the initial setting parameter is stored in the random access memory 220 of the controller 200, the controller 200 may transmit the setting parameter initialization command to the nonvolatile memory device 300 at step S3100, and the steps S3200 to S5520 may be performed as described above with reference to FIG. 3.

In other words, the setting parameter initialization operation, that is, the CAM reset operation, may be performed in the nonvolatile memory device 300 at step S3200. After the setting parameter initialization operation is performed, the controller 200 may transmit a verification parameter read command to the nonvolatile memory device 300 at step S5100, and a verification parameter read operation may be performed in the nonvolatile memory device 300 at step S5200. After the verification parameter read operation is performed, the controller 200 may receive the verification parameter read from the nonvolatile memory device 300 at step S5300, and may compare the initial setting parameter stored in the random access memory 220 and the verification parameter received from the nonvolatile memory device 300 at step S5400. It may be determined that the setting parameter initialization operation has succeeded in the case where the initial setting parameter and the verification parameter are the same as each other at step S5510, and it may be determined that the setting parameter initialization operation has failed in the case where the initial setting parameter and the verification parameter are not the same as each other at step S5520.

Figure 5:
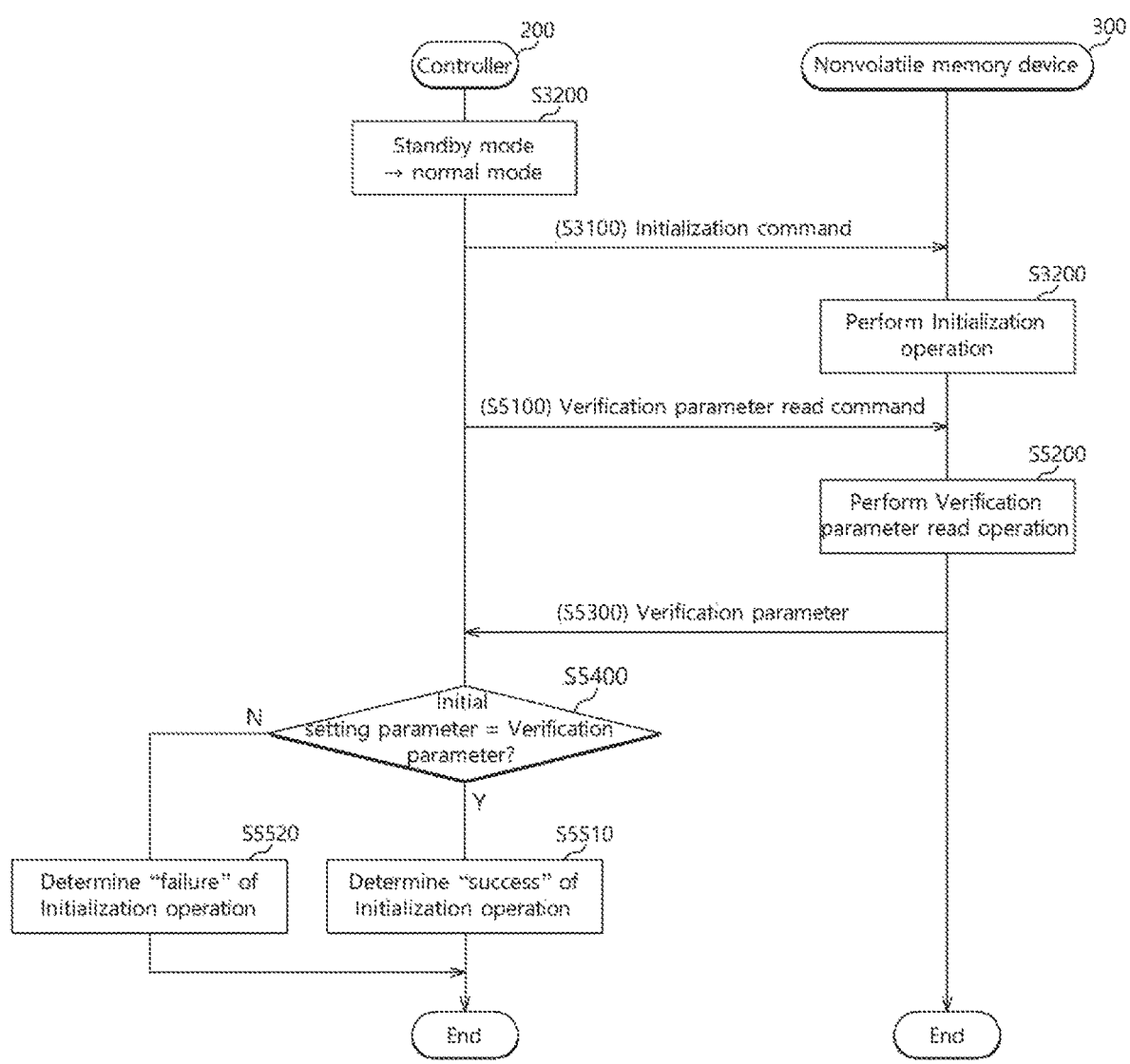

Referring to FIG. 5, after the mode of the memory system 100 is changed from a standby mode to a normal mode at step S2000, the controller 200 may transmit the setting parameter initialization command to the nonvolatile memory device 300 at step S3100. As described above, the control unit 210 may set or control the standby mode or the normal mode. The standby mode may be a low power mode or a power save mode. Then, steps S3200 to S5520 may be performed as described above with reference to FIG. 3.

According to an embodiment, the control unit 210 may control the memory system 100 to be set to the standby mode when a request is not received from the host device in a predetermined time, and may control the memory system 100 to be set to the normal mode from the standby mode when a request is received from the host device after the standby mode is set. The request received from the host device may be a write request or a read request. However, it is to be noted that the embodiments are not limited to such requests; any kind of request transmitted to the memory system 100 from the host device may be applied.

According to an embodiment, a method for operating the memory system 100 may further include determining, by the controller 200, amount of time elapsed from a time at which a last request is received from the host device (not shown); setting, by the controller 200, the memory system 100 to the standby mode when the elapsed time reaches a predetermined time (not shown); and setting, by the controller 200, the memory system 100 to the normal mode when a request is received from the host device (not shown).

Figure 6:
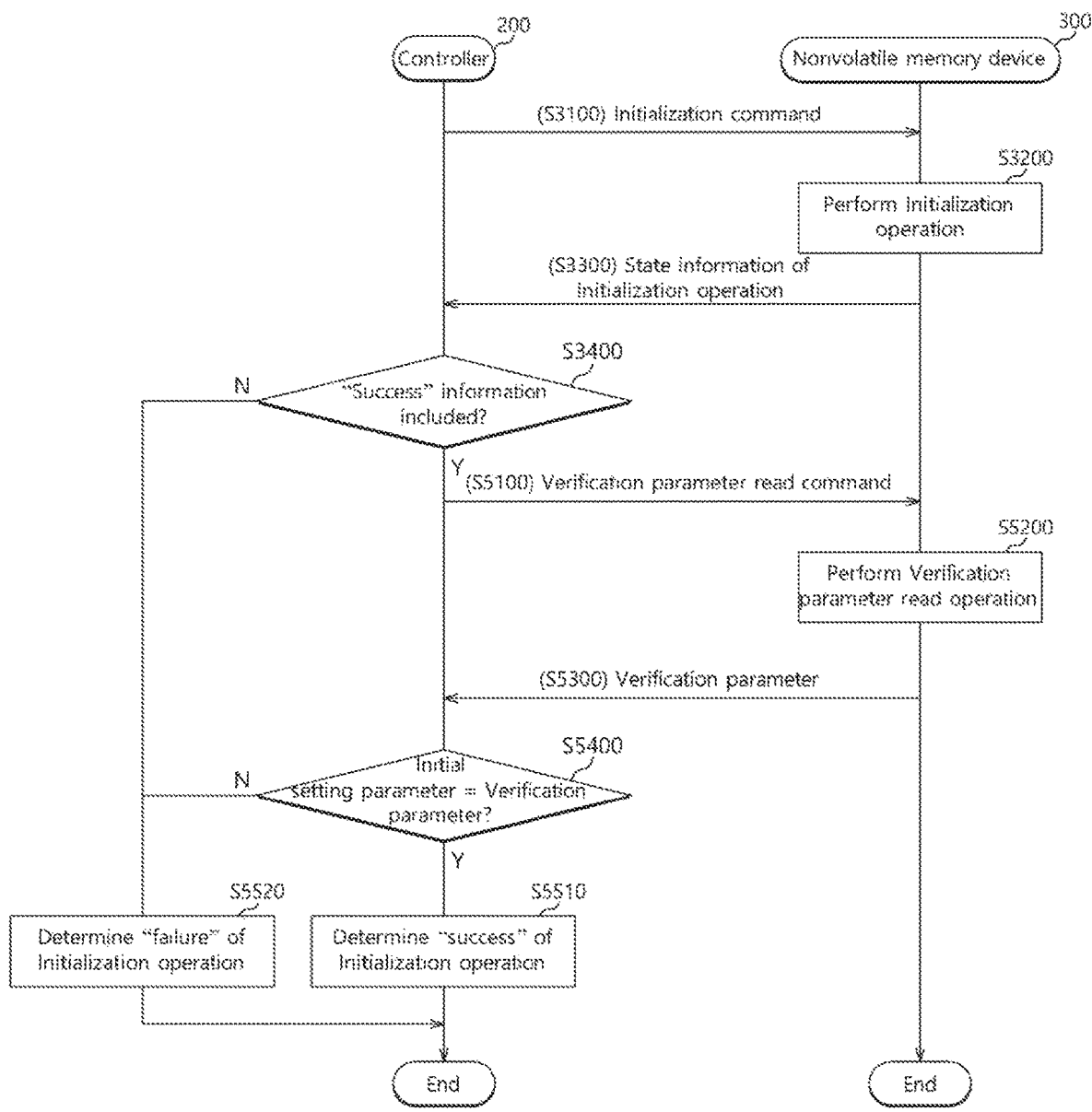

Referring to FIG. 6, a method for operating the memory system 100 in accordance with an embodiment may further include the control unit 210 receiving a state information on the setting parameter initialization operation, that is, the CAM reset operation performed by the nonvolatile memory device 300 in response to the setting parameter initialization command, at step S3300.

According to an embodiment, the control unit 210 may determine that the setting parameter initialization operation has failed in the case where the state information includes failure information, and may determine whether the setting parameter initialization operation has succeeded by comparing a verification parameter read from the nonvolatile memory device 300 and the initial setting parameter stored in the random access memory 220 in the case where the state information includes success information, at step S3400.

In the case where the state information includes success information, the controller 200 may transmit a verification parameter read command to the nonvolatile memory device 300 at step S5100, and steps S5200 to S5520 may be performed as described above with reference to FIG. 3.

In the case where the state information does not include success information, the controller 200 may determine that the setting parameter initialization operation has failed at step S5520.

Figure 7:
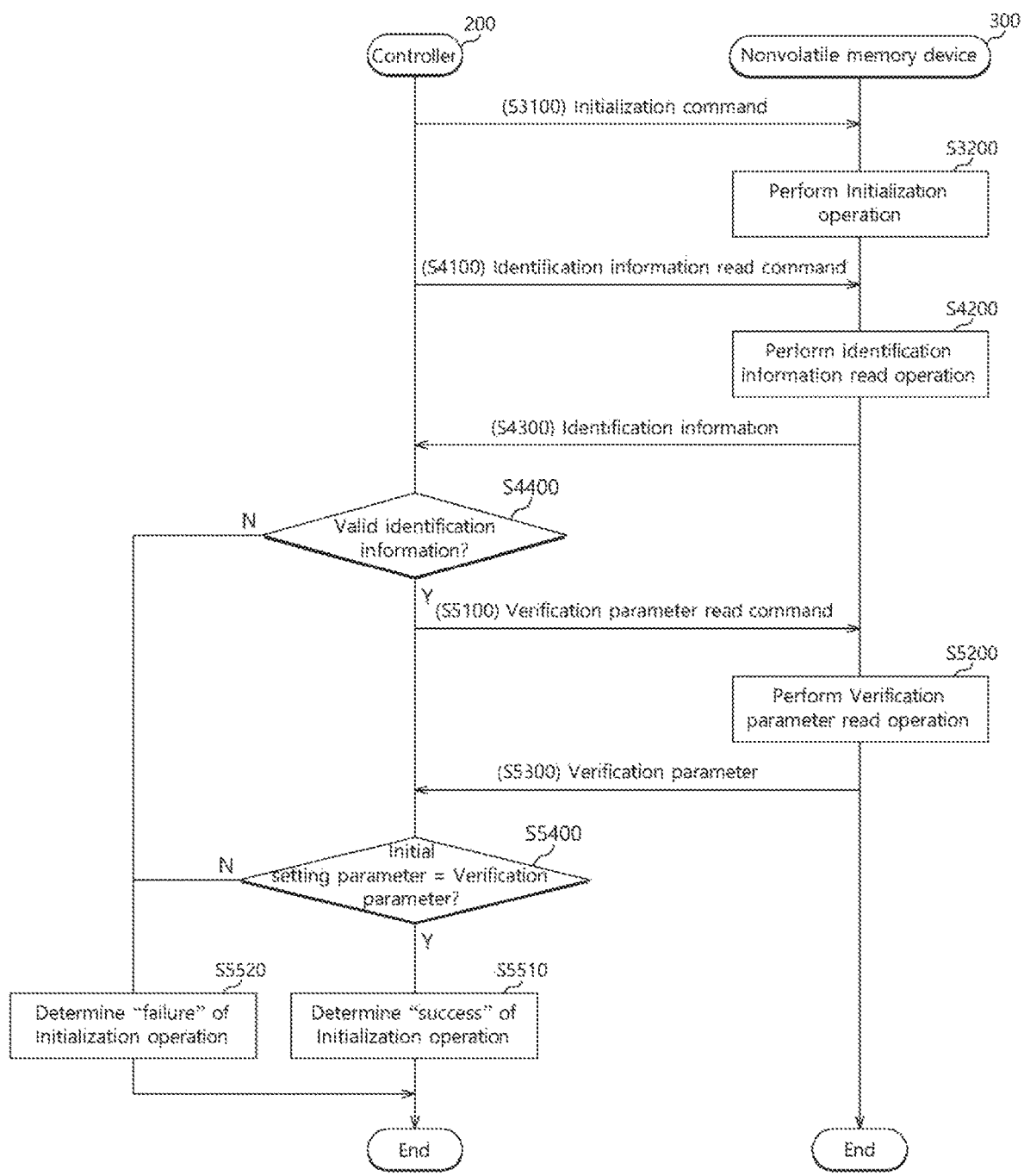

Referring to FIG. 7, the memory system 100 in accordance with an embodiment may further include the identification information determination circuit 211 which determines whether the identification information of the nonvolatile memory device 300 is valid.

According to an embodiment, the controller 200 may receive the identification information of the nonvolatile memory device 300 from the nonvolatile memory device 300, and the identification information determination circuit 211 may determine whether the identification information is valid identification information. Identification information may be an ID value intrinsic to the nonvolatile memory device 300, and valid identification information may be stored in the random access memory 220 of the controller 200.

In detail, after the setting parameter initialization operation is performed in the nonvolatile memory device 300 in response to the setting parameter initialization command of the controller 200 at steps S3100 and S3200, the controller 200 may transmit an identification information read command to the nonvolatile memory device 300 at step S4100.

The nonvolatile memory device 300 may perform an identification information read operation in response to the identification information read command at step S4200, and may transmit to the controller 200 the identification information read in response to the identification information read operation at step S4300.

The identification information determination circuit 211 of the controller 200 may determine whether the identification information received from the nonvolatile memory device 300 is valid identification information at step S4400. In the case where it is determined that the identification information received from the nonvolatile memory device 300 is valid identification information, the controller 200 may transmit the verification parameter read command to the nonvolatile memory device 300 at step S5100. Then, steps S5200 to S5520 may be performed as described above with reference to FIG. 3.

In the case where it is determined that the identification information received from the nonvolatile memory device 300 is not valid identification information, the controller 200 may determine that the setting parameter initialization operation has failed at step S5520.

Figure 8:
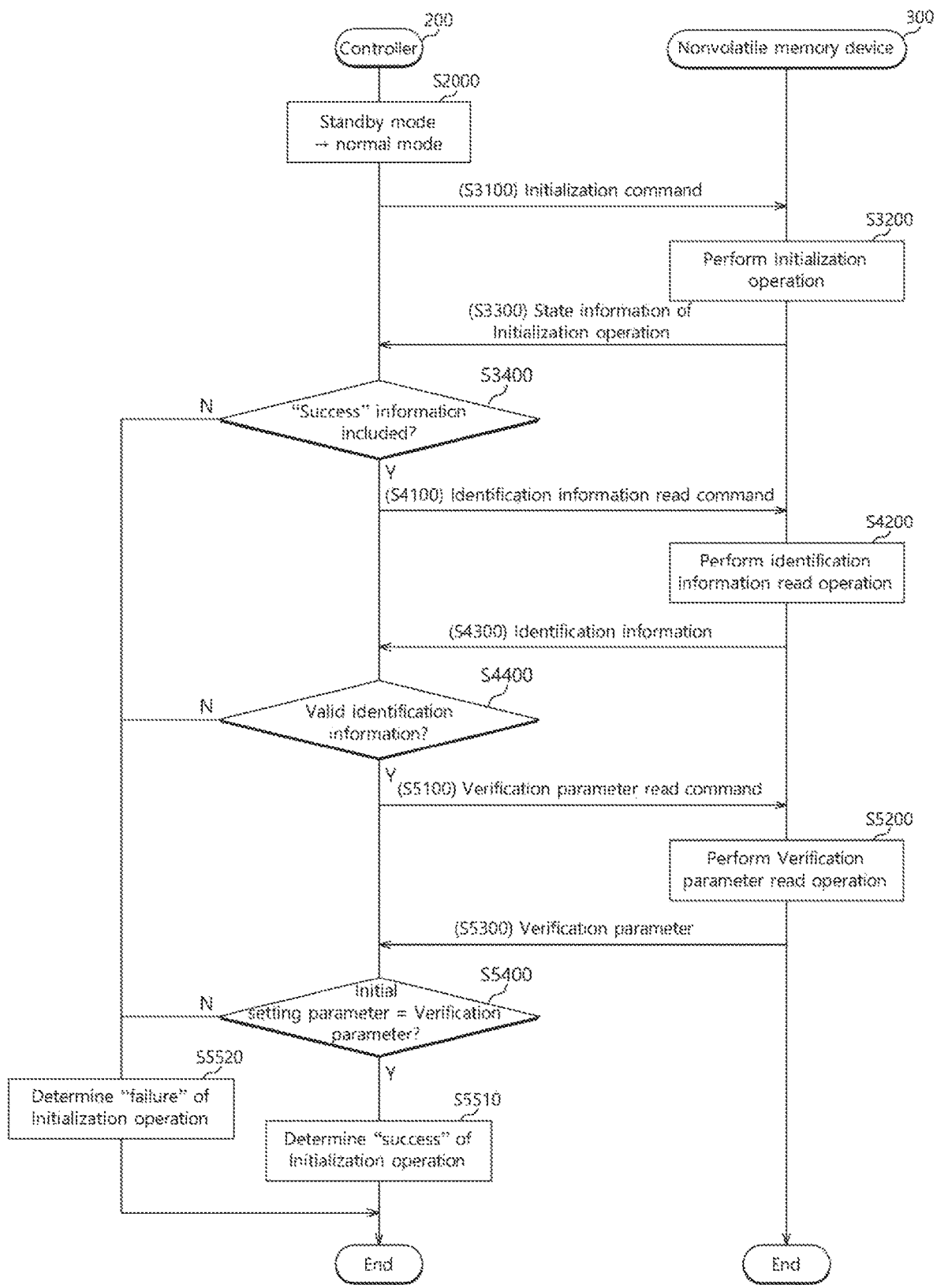

Referring to FIG. 8, the memory system 100 may include the nonvolatile memory device 300 including the CAM region 311, and the controller 200 including the random access memory 220 which stores the initial setting parameter of the nonvolatile memory device 300 and the control unit 210 which controls the setting parameter initialization operation of initializing the setting parameter stored in the CAM region 311.

Also, the control unit 210 may include the parameter determination circuit 212 which determines whether the setting parameter initialization operation has succeeded, by comparing the verification parameter received from the nonvolatile memory device 300 and the initial setting parameter, and the identification information determination circuit 211 which determines whether the identification information is valid identification information.

In the following description, it is assumed that the steps S1000 to S1300 described above with reference to FIG. 4 have been performed. Namely, it is assumed that, after the memory system 100 is booted, the controller 200 receives the initial setting parameter from the nonvolatile memory device 300 and the initial setting parameter is stored in the random access memory 220.

According to an embodiment, a setting parameter initialization command may be transmitted to the nonvolatile memory device 300 from the controller 200 at step S3100, and the setting parameter initialization operation may be performed in the nonvolatile memory device 300 in response to the setting parameter initialization command at step S3200.

For instance, a setting parameter may include at least one among a read voltage, a program voltage, an initial voltage of ISPP voltages, and an increment of the ISPP voltages.

At step S3300, the controller 200 may receive from the nonvolatile memory device 300 the state information on the setting parameter initialization operation, that is, the CAM reset operation performed by the nonvolatile memory device 300 in response to the setting parameter initialization command. The state information may include success information or failure information on the initialization operation.

In the case where the state information received from the nonvolatile memory device 300 includes success information, the controller 200 may transmit an identification information read command to the nonvolatile memory device 300 at steps 53400 and S4100.

Conversely, in the case where the state information does not include success information, the controller 200 may determine that the setting parameter initialization operation has failed at steps S3400 and S5520.

At step S4200 after the setting parameter initialization operation, the identification information read operation may be performed in the nonvolatile memory device 300. The read identification information may be transmitted to the controller 200 at step S4300.

At step S4400, the controller 200 may determine whether the received identification information is valid identification information. The valid identification information as the reference of the determination may be stored in the random access memory 220 of the controller 200.

In the case where it is determined that the identification information of the nonvolatile memory device 300 is not the valid identification information, the controller 200 may determine that the setting parameter initialization operation has failed at step S5520.

Conversely, in the case where the identification information of the nonvolatile memory device 300 is the valid identification information, the controller 200 may transmit the verification parameter read command to the nonvolatile memory device 300 at step S5100, and, in response to the verification parameter read command, the verification parameter read operation may be performed in the nonvolatile memory device 300 at step S5200.

The controller 200 may receive the verification parameter as a result of the verification parameter read operation, from the nonvolatile memory device 300 at step S5300, and the parameter determination circuit 212 may determine a result of the setting parameter initialization operation by comparing the received verification parameter to the initial setting parameter at step S5400. The initial setting parameter may have been stored in the random access memory 220.

In detail, it may be determined that the setting parameter initialization operation has succeeded in the case where the verification parameter is the same as the initial setting parameter at step S5510, and it may be determined that the setting parameter initialization operation of the setting parameter has failed, in the case where the verification parameter is not the same as the initial setting parameter at step S5520.

According to an embodiment, by performing a verification parameter read operation in the nonvolatile memory device 300 and determining whether an initialization operation has succeeded by comparing the read verification parameter to the initial setting parameter, it is possible to decrease the frequency of occurrence of a case in which state information includes success information even though the setting parameter initialization operation has not succeeded or in which it is determined that the setting parameter initialization operation has succeeded as it is determined that identification information is valid.

As a result, the possibility of an error occurring during another operation of the nonvolatile memory device 300 decreases, and, even when an error has occurred, the possibility that such error occurred in the process of performing another operation and is not attributable to an error of the setting parameter initialization operation is high. Therefore, error detection probability may increase, and the reliability of a system may be improved.

Figure 9:
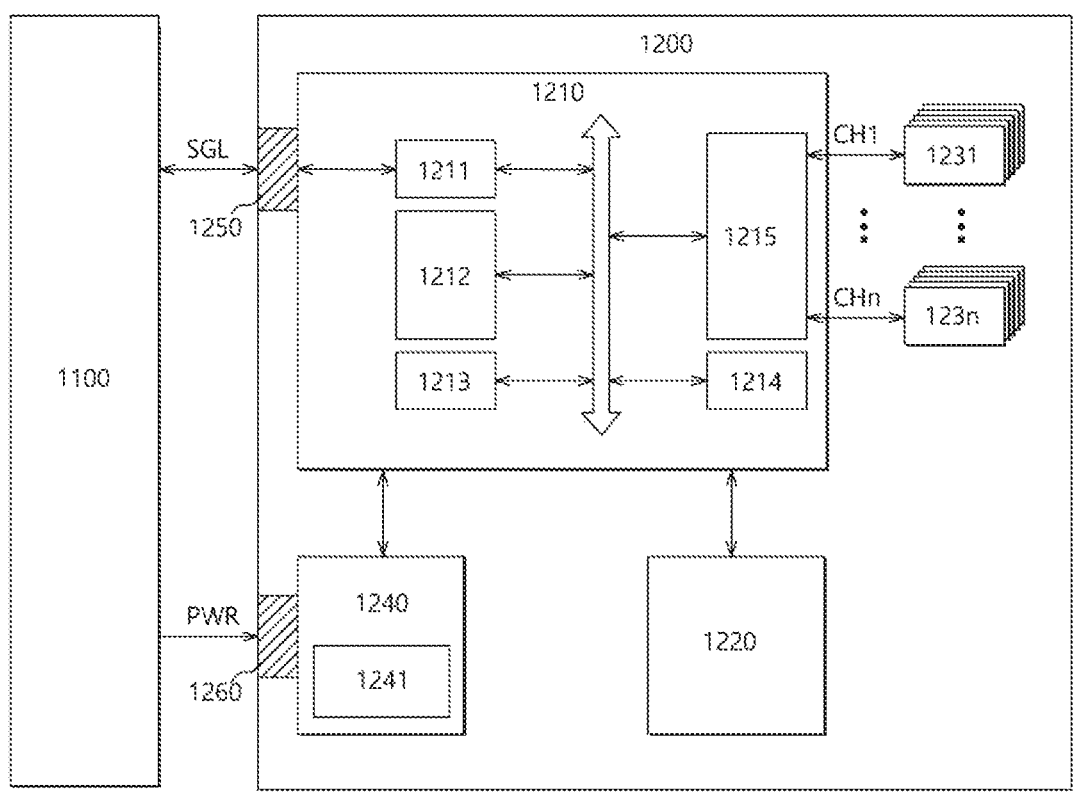
FIG. 9 is a diagram illustrating a data processing system including a solid state drive (SSD) in accordance with an embodiment.

FIG. 9 is a diagram illustrating a data processing system including a solid state drive (SSD) in accordance with an embodiment. Referring to FIG. 9, a data processing system 1000 may include a host device 1100 and an SSD 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface 1211, a control component 1212, a random access memory 1213, an error correction code (ECC) component 1214, and a memory interface 1215.

The host interface 1211 may exchange a signal SGL with the host device 1100 through the signal connector 1250. The signal SGL may include a command, an address, data, and the like. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-E) and universal flash storage (UFS).

The control component 1212 may analyze and process a signal SGL inputted from the host device 1100. The control component 1212 may control operations of internal function blocks according to firmware or software for driving the SSD 1200. The random access memory 1213 may be used as a working memory for driving such firmware or software.

The error correction code (ECC) component 1214 may generate parity data of data to be transmitted to the nonvolatile memory devices 1231 to 123n. The generated parity data may be stored together with the data in the nonvolatile memory devices 1231 to 123n. The error correction code (ECC) component 1214 may detect an error of the data read out from the nonvolatile memory devices 1231 to 123n, based on the parity data. If a detected error is within a correctable range, the error correction code (ECC) component 1214 may correct the detected error.

The memory interface 1215 may provide control signals such as commands and addresses to the nonvolatile memory devices 1231 to 123n, according to the control of the control component 1212. Moreover, the memory interface 1215 may exchange data with the nonvolatile memory devices 1231 to 123n, according to the control of the control component 1212. For example, the memory interface 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the interior of the SSD 1200. The power supply 1240 may include an auxiliary power supply 1241. The auxiliary power supply 1241 may supply power to allow the SSD 1200 to be properly terminated when a sudden power-off occurs. The auxiliary power supply 1241 may include large capacity capacitors.

The signal connector 1250 may be configured as any of various types of connectors depending on an interface scheme between the host device 1100 and the SSD 1200.

The power connector 1260 may be configured as any of various types of connectors depending on a power supply scheme of the host device 1100.

Figure 10:
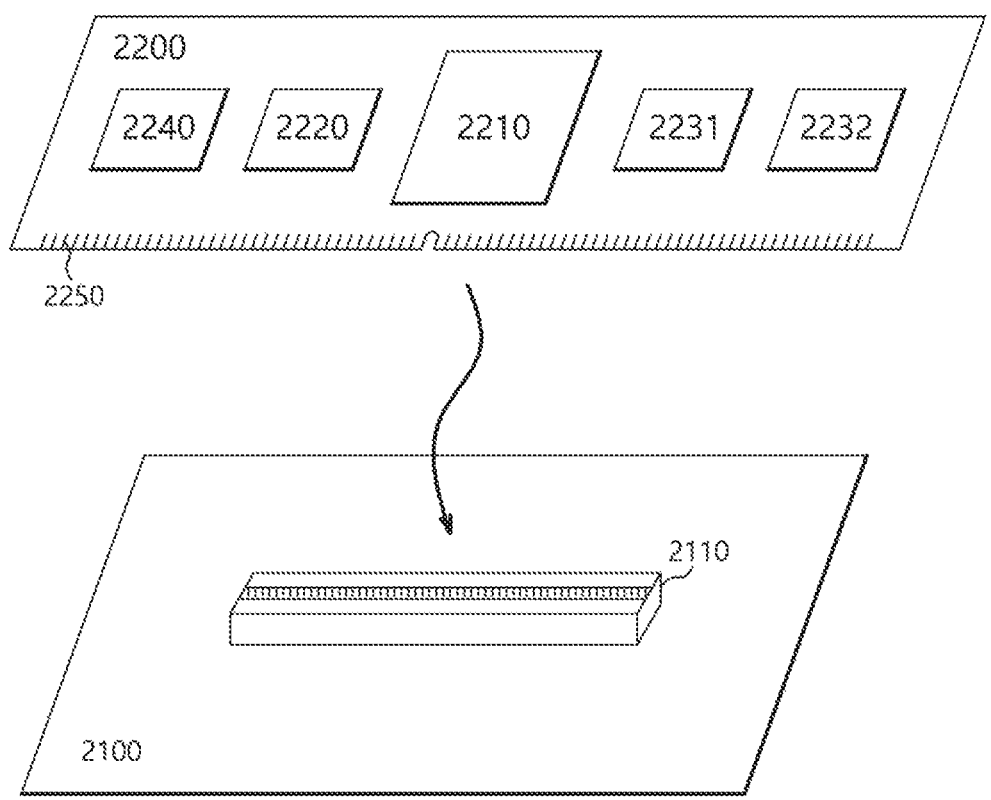
FIG. 10 is a diagram illustrating a data processing system including a memory system in accordance with an embodiment.

FIG. 10 is a diagram illustrating a data processing system including a memory system in accordance with an embodiment. Referring to FIG. 10, a data processing system 2000 may include a host device 2100 and a memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control the general operations of the memory system 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as the storage media of the memory system 2200.

The PMIC 2240 may provide the power inputted through the connection terminal 2250, to the interior of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be constructed into various types depending on an interface scheme between the host device 2100 and the memory system 2200. The connection terminal 2250 may be disposed on any side of the memory system 2200.

Figure 11:
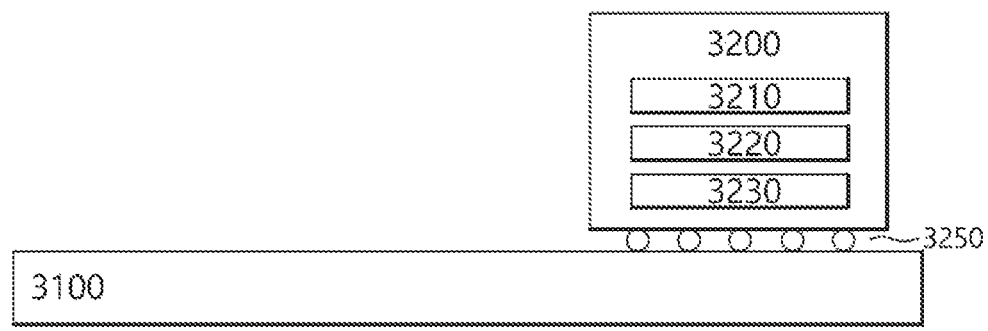
FIG. 11 is a diagram illustrating a data processing system including a memory system in accordance with an embodiment.

FIG. 11 is a diagram illustrating a data processing system including a memory system in accordance with an embodiment. Referring to FIG. 11, a data processing system 3000 may include a host device 3100 and a memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control the general operations of the memory system 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
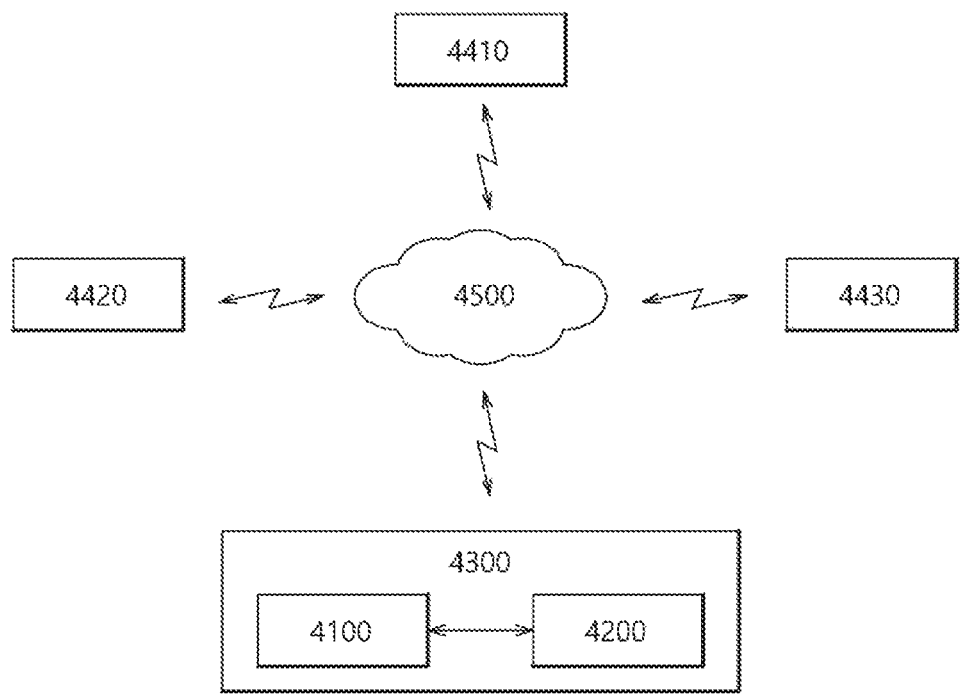
FIG. 12 is a diagram illustrating a network system including a memory system in accordance with an embodiment.

FIG. 12 is a diagram illustrating a network system including a memory system in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured in the same manner as the memory system 100 of FIG. 1, the SSD 1200 of FIG. 9, the memory system 2200 of FIG. 10 or the memory system 3200 of FIG. 11.

While various embodiments have been described above, it will be understood to those skilled in the art that the embodiments described are examples only. Accordingly, the memory system and the operating method thereof described herein are not limited to the described embodiments. Rather, such memory system and operating method thereof encompass changes and modifications within the spirit and scope of the present disclosure as defined by the following claims.

What is claimed is:

1. A memory system comprising:
a nonvolatile memory device including a content addressable memory (CAM) region which stores a setting parameter; and a controller including a random access memory which receives and stores an initial setting parameter upon booting of the memory system, and a control unit which controls the nonvolatile memory device to perform a CAM reset operation for the setting parameter stored in the CAM region during an initialization operation according to an initialization command, wherein the control unit includes a parameter determination circuit which determines whether the initialization operation has succeeded by comparing the setting parameter received from the nonvolatile memory device after the initialization operation to the initial setting parameter stored in the random access memory, wherein the control unit sets a standby mode when a request is not received from a host device in a predetermined time, and switches to a normal mode when a request is received from the host device after the standby mode is set, and wherein the control unit transmits the initialization command to the nonvolatile memory device when the standby mode is switched to the normal mode.

2. The memory system according to claim 1, wherein the parameter determination circuit determines that the initialization operation has succeeded in the case where the setting parameter and the initial setting parameter are the same as each other, and determines that the initialization operation has failed in the case where the setting parameter and the initial setting parameter are not the same as each other.

3. The memory system according to claim 1,
wherein the control unit determines that the initialization operation has failed in the case where state information received from the nonvolatile memory device in response to the initialization command includes failure information.

4. The memory system according to claim 3, wherein the parameter determination circuit determines whether the initialization operation has succeeded by comparing the setting parameter to the initial setting parameter in the case where the state information includes success information.

5. The memory system according to claim 3,
wherein the controller receives identification information of the nonvolatile memory device from the nonvolatile memory device, and wherein the control unit further includes an identification information determination circuit which determines whether the identification information is valid identification information.

6. The memory system according to claim 5,
wherein the identification information determination circuit determines whether the identification information is valid in the case where the state information includes success information, and wherein the control unit determines that the initialization operation has failed in the case where it is determined that the identification information is not valid identification information.

7. The memory system according to claim 5, wherein the parameter determination circuit determines whether the initialization operation has succeeded by comparing the setting parameter to the initial setting parameter in the case where it is determined by the identification information determination circuit that the identification information is valid identification information.

8. The memory system according to claim 1,
wherein the control unit controls the initialization operation based on the initial setting parameter.

9. The memory system according to claim 1, wherein each of the setting parameter and the initial setting parameter includes at least one of a read voltage, a program voltage, an initial voltage of incremental step pulse programming (ISPP) voltages, and an increment of the ISPP voltages.

10. A method for operating a memory system, comprising:
receiving and storing, by a controller, an initial setting parameter from a nonvolatile memory device upon booting of the memory system;
controlling, by the controller, the nonvolatile memory device to perform a CAM reset operation for a setting parameter stored in a content addressable memory (CAM) region during an initialization operation according to an initialization command;
transmitting, by the controller, setting parameter read command to the nonvolatile memory device;
performing, by the nonvolatile memory device, a read operation for a setting parameter;
transmitting, by the nonvolatile memory device, the setting parameter to the controller;
comparing, by the controller, the setting parameter and the initial setting parameter; and
determining, by the controller, whether the initialization operation has succeeded based on a result of the comparing of the setting parameter to the initial setting parameter,
wherein the controller sets a standby mode when a request is not received from a host device in a predetermined time, and switches to a normal mode when a request is received from the host device after the standby mode is set, and
wherein the controller transmits the initialization command to the nonvolatile memory device when the standby mode is switched to the normal mode.

11. The method according to claim 10, wherein the determining of whether the initialization operation has succeeded comprises:
determining that the initialization operation has succeeded in the case where the setting parameter and the initial setting parameter are the same as each other, and determining that the initialization operation has failed in the case where the setting parameter and the initial setting parameter are not the same as each other.

12. The method according to claim 10, further comprising:
transmitting, by the controller, an initial setting parameter read command to the nonvolatile memory device;
performing, by the nonvolatile memory device, a read operation for the initial setting parameter;
transmitting, by the nonvolatile memory device, the initial setting parameter to the controller; and
storing, by the controller, the initial setting parameter in a random access memory.

13. The method according to claim 10, further comprising:
determining, by the controller, an elapsed time from a time at which a last request is received from the host device;
setting, by the controller, the memory system to the standby mode when the elapsed time reaches the predetermined time; and
setting, by the controller, the memory system to the normal mode when the request is received from the host device,
wherein the transmitting of the setting parameter read command is performed when the memory system is set to the normal mode.

14. The method according to claim 10, further comprising:
transmitting, by the controller, the initialization command to the nonvolatile memory device;
performing, by the nonvolatile memory device, the initialization operation including resetting the setting parameter in response to the initialization command;
transmitting, by the nonvolatile memory device, state information including success information or failure information of the initialization operation to the controller; and
determining, by the controller, whether to transmit the setting parameter read command based on the state information.

15. The method according to claim 14, wherein the transmitting of the setting parameter read command comprises:
transmitting the setting parameter read command to the nonvolatile memory device in the case where the state information includes the success information.

16. The method according to claim 10, further comprising:
transmitting, by the controller, a read command for identification information of the nonvolatile memory device to the nonvolatile memory device;
transmitting, by the nonvolatile memory device, the identification information of the nonvolatile memory device to the controller;
determining, by the controller, whether the identification information is valid; and
determining, by the controller, whether to transmit the setting parameter read command based on whether the identification information is valid.

17. The method according to claim 16, wherein the transmitting of the setting parameter read command comprises:
transmitting the setting parameter read command to the nonvolatile memory device in the case where it is determined that the identification information is valid.

18. The method according to claim 10, wherein each of the setting parameter and the initial setting parameter includes at least one of a read voltage, a program voltage, an initial voltage of incremental step pulse programming (ISPP) voltages, and an increment of the ISPP voltages.

19. A memory system comprising:
a memory device suitable for storing a setting parameter thereof and a verification parameter corresponding to the setting parameter; and
a controller suitable for:
receiving and storing an initial setting parameter of the memory device upon booting of the memory system;
controlling the memory device to perform a reset operation on a region storing the setting parameter during an initialization operation according to an initialization command; and
determining success of the initialization operation by comparing the initial setting parameter and the verification parameter that resets the setting parameter upon the initialization operation of the memory system,
wherein the controller sets a standby mode when a request is not received from a host device in a predetermined time, and switches to a normal mode when a request is received from the host device after the standby mode is set, and wherein the controller transmits the initialization command to the nonvolatile memory device when the standby mode is switched to the normal mode.

\* \* \* \* \*